(12) United States Patent
Hol et al.

(10) Patent No.: US 7,145,269 B2
(45) Date of Patent: Dec. 5, 2006

(54) LITHOGRAPHIC APPARATUS, LORENTZ ACTUATOR, AND DEVICE MANUFACTURING METHOD

(75) Inventors: Sven Antoin Johan Hol, Eindhoven (NL); Henrikus Herman Marie Cox, Eindhoven (NL); Hernes Jacobs, Eindhoven (NL); Patricia Vreugdewater, Eindhoven (NL); Koen Jacobus Johannes Marie Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 183 days.

(21) Appl. No.: 10/796,291

(22) Filed: Mar. 10, 2004

(65) Prior Publication Data

US 2005/0200208 A1    Sep. 15, 2005

(51) Int. Cl.
*H02K 41/00* (2006.01)
(52) U.S. Cl. ...................................................... 310/12
(58) Field of Classification Search ............. 310/12–14
See application file for complete search history.

(56) References Cited

U.S. PATENT DOCUMENTS 4,758,750 A    7/1988  Itagaki et al. ................. 310/13
6,373,153 B1    4/2002  Hazelton et al. .............. 310/12
2003/0052548 A1    3/2003  Hol et al.

FOREIGN PATENT DOCUMENTS

| EP | 1 286 222 A1 | 2/2003 |
|----|--------------|--------|
| JP | 2003-88088   | 3/2003 |

OTHER PUBLICATIONS

Machine language translation of European reference 2003088088 published Mar. 20, 2003, inventor Kawai Eiji.*

* cited by examiner

*Primary Examiner*—Tran Nguyen
(74) *Attorney, Agent, or Firm*—Pillsbury Winthrop Shaw Pittman LLP

(57) ABSTRACT

A lithographic apparatus comprising a highly effective Lorentz actuator, is presented. The Lorentz actuator comprises a main magnet system and a subsidiary magnet system arranged in Halbach configuration, an electrically conductive element for producing a force via the interaction of an electric current carried by the electrically conductive element and a resulting field of the first and second magnetic field generated by the main and subsidiary magnet system, respectively. The actuator further comprises a magnetic element extending substantially between outer sides of the first and second magnet system subassemblies. The magnetic element guides a portion of the second, subsidiary field between the first and second magnet system subassemblies.

16 Claims, 3 Drawing Sheets

LITHOGRAPHIC APPARATUS, LORENTZ ACTUATOR, AND DEVICE MANUFACTURING METHOD

BACKGROUND OF THE INVENTION

1. Field of the Invention

The present invention relates to a lithographic apparatus, a Lorentz actuator, and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A lithographic apparatus of the type described above employ a plurality of actuators for positioning a part of the apparatus. Such actuators are applied for positioning a substrate table, a part of an irradiation system, a part of an illumination system or any other part of the lithographic apparatus.

SUMMARY OF THE INVENTION

An example of actuators for use in a lithographic apparatus is described in EP-1 286 222 and US Pat. Pub. 2003/0052548, the contents of which are incorporated herein by reference. These documents describe a Lorentz actuator comprising a main magnet system providing a first magnetic field, a subsidiary magnet system providing a second magnetic field, and an electrically conductive element. The main magnet system and the subsidiary magnet system are arranged in Halbach configuration. A magnetization direction of the magnets of the subsidiary magnet system is perpendicular to a magnetization direction of the magnets of the main magnet system.

The principles of the present invention, as embodied and broadly described herein, provide for an improved Lorentz actuator. In one embodiment, a lithographic apparatus incorporating such an actuator comprises an illumination system for providing a beam of radiation, a support structure for supporting a patterning device, the patterning device imparting the beam of radiation with a pattern in its cross-section, a substrate holder for holding a substrate, a projection system for projecting the patterned beam onto a target portion of the substrate, and a Lorentz actuator for producing a force between a first and a second part of the apparatus.

The Lorentz actuator comprises a main magnet system, attached to said first part of the apparatus, for providing a first magnetic field, a subsidiary magnet system, attached to said first part of the apparatus, for providing a second magnetic field, the main magnet system and the subsidiary magnet system being arranged in a Halbach configuration, and an electrically conductive element attached to said second part of the apparatus. The electrically conductive element being arranged so as to produce said force by interaction of an electric current carried by said electrically conductive element and a resulting field of the first magnetic field and the second magnetic field, at least a part of the electrically conductive element being located between first and second magnet system subassemblies each comprising a part of the main and subsidiary magnet systems, wherein the Lorentz actuator further comprises a magnetic element extending substantially between outer sides of the first and second magnet system subassemblies, the magnetic element for guiding a part of the second magnetic field from one of the first and second magnet system subassemblies to the other one of the first and second magnet system subassemblies.

A description of the Halbach configuration can be found in US Pat. Pub. 2003/0052548 and EP1286222. The magnetic element may comprise a material which is magnetically permeable or a material comprising permanent magnetism. The magnetic element extends, on a side of the first and second magnet system subassemblies, between these subassemblies for guiding a part of the second field (i.e. the field generated by the subsidiary magnet system) between the first and second magnet system subassemblies. The magnetic element is positioned such that it in operation guides a part from the second field from one of the first and second magnet system subassemblies to the other one of the first and second magnet system subassemblies. The magnetic element thus effectively short circuits a part of the second magnetic field. As a result of the addition of the magnetic element, efficiency of the actuator is increased because the subsidiary magnet system is better used. The efficiency is increased as due to the magnetic element, a field at a location of the conductive element is increased.

The increase in actuator efficiency can be expressed as an increase in steepness of the actuator (expressed as $F^2_x/P_{diss}$, where $F_x$ is the force generated by the actuator and $P_{diss}$ is the dissipation by the actuator). Due to the increased steepness, the actuator can either be designed smaller, leading to smaller magnet systems hence resulting in a decreased actuator mass. Otherwise, it is possible, while maintaining dimensions of the actuator, to increase the force generated by the actuator, thus increasing acceleration that can be achieved with the actuator without increasing dissipation.

It will also be appreciated that the reluctance forces of the actuator may increase by addition of the magnetic element, e.g. comprising a ferromagnetic material. However, in an advantageous embodiment of the invention, a distance between the conductive element and the magnetic element is sufficiently large for causing the reluctance force of the Lorentz actuator to be less than 1% of a maximum Lorentz force of the Lorentz actuator. As a consequence, the reluctance forces are that low that these non-linear forces which change when the first and second part are displayed with respect to each other, only play a minor role. As a further positive effect, it has been observed that stray fields of the actuator are reduced due to the magnetic element. A still further advantage is the increase of structural stiffness of the actuator due to the presence of the magnetic elements in particular when establishing a mechanical connection between the first and second magnet system subassemblies. Although this document refers to a first and second magnetic field, the skilled person will understand that these fields together result in a total, effective field.

In an advantageous, effective and easy to implement embodiment, the magnetic element comprises a highly magnetically permeable material i.e. a material having a relative permeability >1, such as iron. The magnetic element preferably extends between mutually opposing subsidiary magnets comprised in the subsidiary magnet system, the mutually opposing subsidiary magnets having substantially antiparallel polarisations. Thus, a short circuit between the fields of the mutually opposing subsidiary magnets is provided in an effective manner.

Advantageously, the magnetic element extends between sides of the mutually opposing subsidiary magnets faced from adjacent main magnets of the main magnet system, hence providing an effective coupling of the magnetic field between the mutually opposing subsidiary magnets and the magnetic element.

Further, in another advantageous embodiment the magnetic element comprises a permanent magnet (a hard magnetic material) having a polarity in a direction from one of the first and second magnet system subassemblies to the other one of the first and second magnet system subassemblies. An advantage is that more magnetic volume (causing the second field) can be added, which further increases efficiency of the actuator by increasing the field at the location of the conductive element. The magnetic element advantageously extends between parts comprising a highly magnetically permeable material (such as iron) adjacent to main magnets of the first and second magnet system subassemblies.

The invention further comprises a Lorentz actuator for producing a force between a first and a second movable part, the Lorentz actuator comprises a main magnet system, attached to said first part, for providing a first magnetic field, and a subsidiary magnet system, attached to said first part, for providing a second magnetic field. The main magnet system and the subsidiary magnet system being arranged in a Halbach configuration, and an electrically conductive element attached to said second part and arranged so as to produce said force by interaction of an electric current carried by said electrically conductive element and a resulting field of the first magnetic field and the second magnetic field, at least a part of the electrically conductive element being located between first and second magnet system subassemblies.

These subassemblies each comprise a part of the main and subsidiary magnet systems, wherein the Lorentz actuator further comprises a magnetic element extending substantially between outer sides of the first and second magnet system subassemblies, the magnetic element for guiding a part of the second magnetic field from one of the first and second magnet system subassemblies to the other one of the first and second magnet system subassemblies.

Still further, the invention comprises a device manufacturing method comprising providing a substrate, providing a projection beam of radiation using an illumination system, using patterning device to impart the projection beam with a pattern in its cross-section; projecting the patterned beam of radiation onto a target portion of the substrate, and producing a force for causing a displacement of the beam and the substrate with respect to each other, by providing a first magnetic field, providing a second magnetic field, wherein the first magnetic field and the second magnetic field being arranged in a Halbach configuration.

The method further comprises guiding an electric current via an electrically conductive element attached to said second part of the apparatus, for producing said force by interaction of the electric current carried by said electrically conductive element and a resulting field of the first magnetic field and the second magnetic field, and guiding a part of the second magnetic field from one of a first and a second magnet system subassemblies providing the first and second magnetic fields to the other one of the first and second magnet system subassemblies.

With the Lorentz actuator according to the invention and the device manufacturing method according to the invention, the same or similar effects and advantages are achieved as with the lithographic apparatus according to the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to mechanism that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
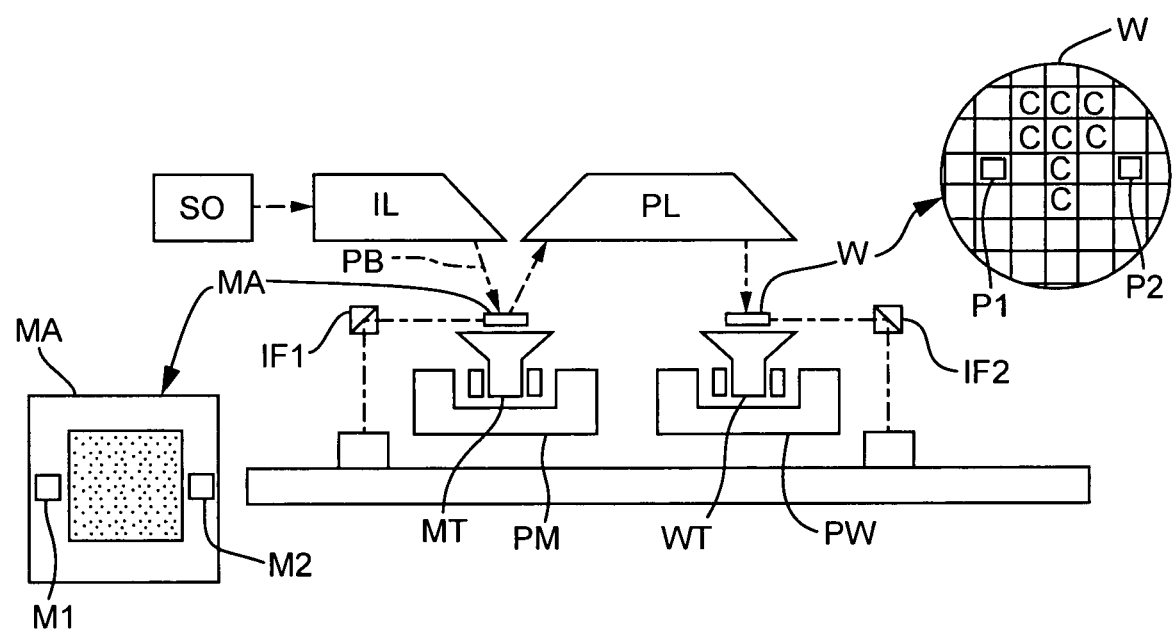
FIG. 1 depicts a lithographic apparatus in which the invention can be embodied.

FIG. 1 schematically depicts a lithographic apparatus 100 according to a particular embodiment of the invention. The apparatus comprises:

an illumination system (illuminator) IL: for providing a projection beam PB of radiation (e.g. UV or EUV radiation).

a first support structure (e.g. a mask table/holder) MT: for supporting patterning device (e.g. a mask) MA and connected to first positioning mechanism PM for accurately positioning the patterning device with respect to item PL;

a substrate table (e.g. a wafer table/holder) WT: for holding a substrate (e.g. a resist-coated wafer) W and connected to second positioning mechanism PW for accurately positioning the substrate with respect to item PL; and a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

As noted above, lithographic apparatus 100 employ actuators for positioning a part of the apparatus, such as positioning a substrate table/holder, a mask table/holder, a part of an irradiation system, a part of an illumination system, or any other part of the lithographic apparatus 100.

Figure 2:
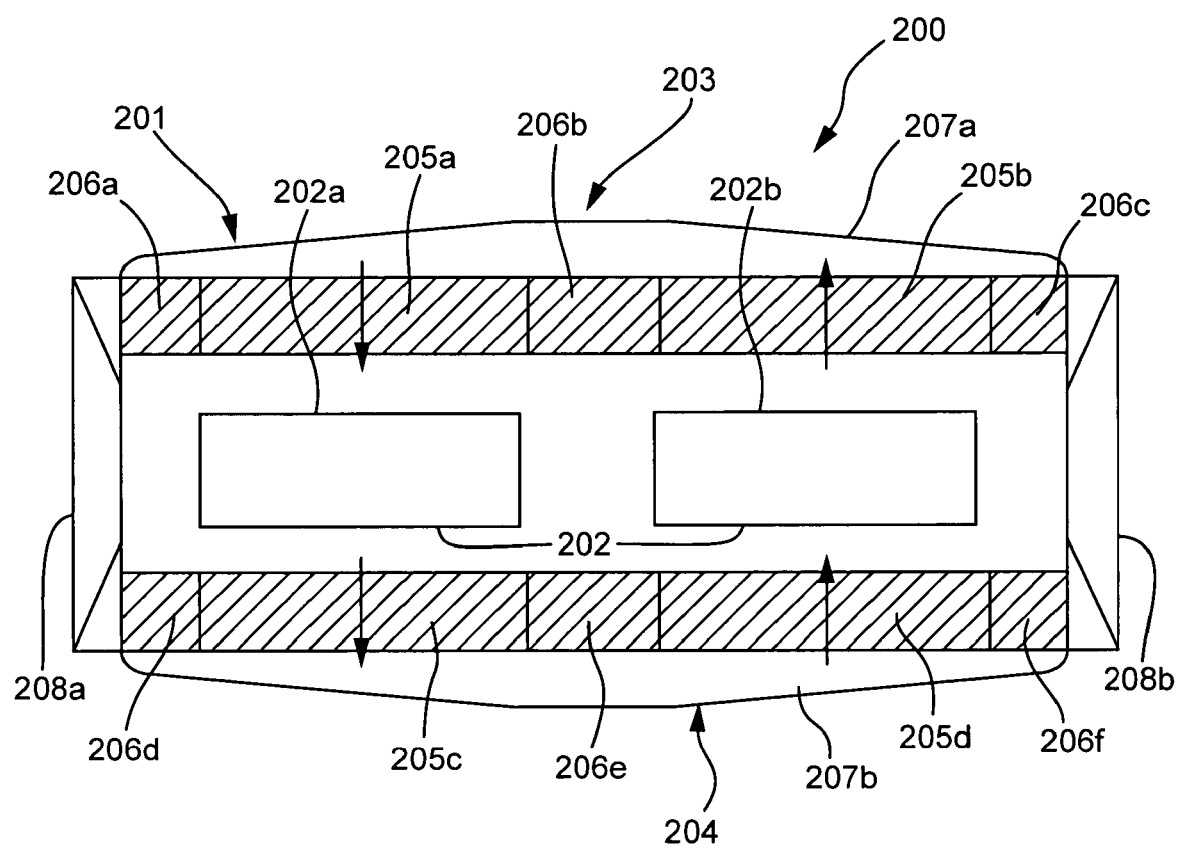
FIG. 2 depicts a cross sectional view of a Lorentz actuator according to the invention.

FIG. 2 shows a cross sectional view of a Lorentz actuator 200, in accordance with an embodiment of the present invention. The Lorentz actuator comprises a first actuator subassembly 201 and a second actuator subassembly 202, which is movable with respect to the first subassembly 201. The first actuator subassembly 201 comprises a first and a second magnet system subassembly 203,204, respectively, comprising a main and a subsidiary magnet system. The main and subsidiary magnet system are attached to one part of the lithographic apparatus 100. The main magnet system comprises main magnets 205a, 205b, 205c, 205d. The polarity of the main magnets 205a, 205b, 205c and 205d is indicated by the arrow as drawn in the respective main magnet.

The actuator 200 is configured to generate a force having a direction as indicated by FIG. 2 from left to right or vice versa, in the plane of the drawing. The force acts between the main magnets 205a–205d and the second actuator subassembly 202, which is attached to another part of lithographic apparatus 100. The second actuator assembly 202 comprises an electrically conductive element, such as a coil. In fact, the parts 202 in this embodiment represent a cross sectional view of a coil, an electrical current in one part of the coil 202a having an opposite direction than an electrical current in the other part 202b of the coil. For this reason, polarity of the main magnets 205a, 205c, is opposite to polarity of the main magnets 205b, 205d.

The first and second magnet system subassemblies 203, 204 further comprise the subsidiary magnet system comprising the subsidiary magnets 206a, 206b, 206c, 206d, 206e and 206f, which are in combination with the main magnet system. In one embodiment, the subsidiary magnets 206a, 206b, 206c, 206d, 206e and 206f are arranged in Halbach configuration.

The actuator 200 further comprises a back mass 207a, 207b, such as a back iron. According to the invention, magnetic elements 208a, 208b are provided which extend between outer sides, e.g. edges of the first 203 and the second 204 magnet system subassemblies. An effect of the magnetic elements 208a, 208b will be explained with reference to FIGS. 3a and 3b below.

Figure 3A:
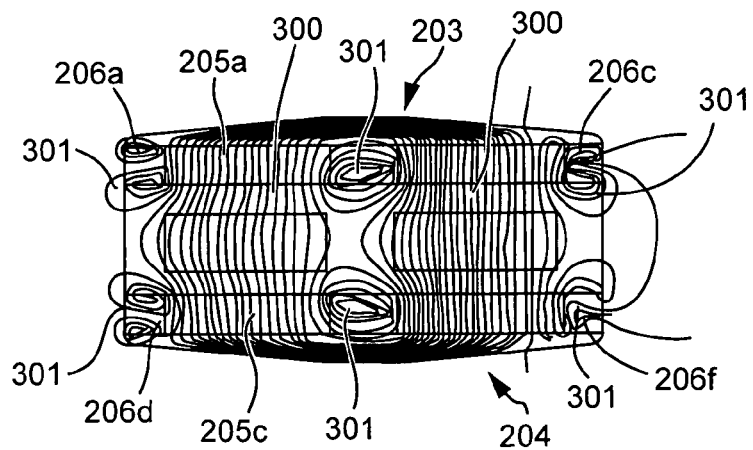
FIGS. 3a and 3b depict field lines of magnetic fields in a cross sectional view of a Lorentz actuator according to the state of the art and a Lorentz actuator according to the invention.
Figure 3B:
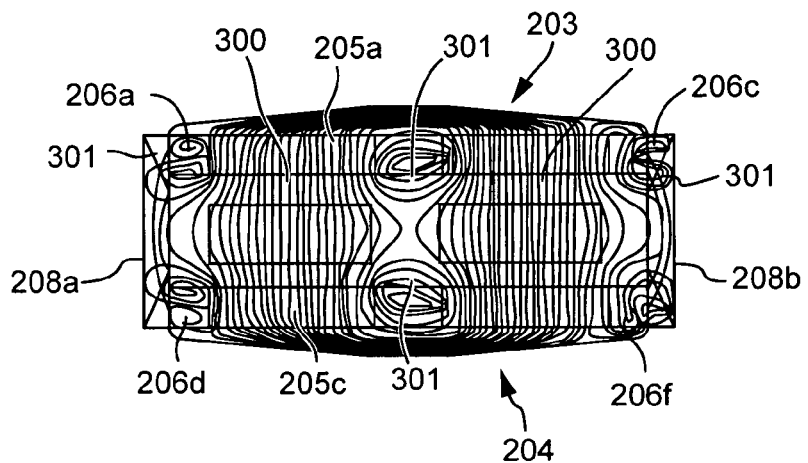

FIG. 3a and FIG. 3b depict the Lorentz actuator as described with reference to FIG. 2, however in FIG. 3a (opposed to FIG. 3b), the magnetic elements 208a, 208b, have been removed. In FIGS. 3a and 3b, field lines of the first, main magnetic field are indicated by 300 while field lines of the second, subsidiary magnetic field are indicated by 301. As can be seen with reference to FIG. 3b, a part of the subsidiary magnetic field from the subsidiary magnets 206a and 206d is short-circuited by the magnetic element 208a.

Likewise, a part of the subsidiary magnetic field originating from the subsidiary magnet 206c and 206f is short-circuited by the magnetic element 208b. As a consequence thereof, a field at a location of the coil 202, near the coil 202 is increased in FIG. 3b as compared to FIG. 3a. A further effect is that the magnetic elements 208a, 208b shield the actuator from possibly disturbing external magnetic fields. The magnetic element 208a, 208b can comprise an iron or any other highly magnetically permeable material, having a relative permeability >1.

The magnetic element comprises the magnetically permeable material that extends between mutually opposing subsidiary magnets 206a, 206d comprised in the subsidiary magnet system, the mutually opposing subsidiary magnets having substantially anti-parallel polarization's. In an advantageous configuration, the magnetic element extends between sides of the mutually opposing subsidiary magnets 206a, 206d faced from adjacent main magnets 205a, 205c of the main magnet system. A distance between the magnetic elements 208a and the conductive element 202a is that large that a reluctance force of the actuator is less than 1% of a Lorentz force of the actuator. The reluctance force decreases when the above distance increases.

Figure 4:
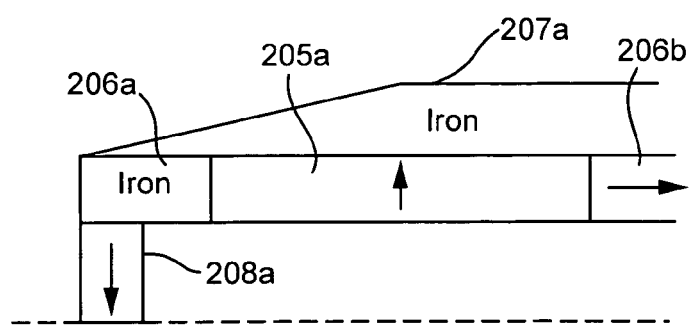
FIG. 4 depicts a cross sectional view of a part of an alternative embodiment of the Lorentz actuator according to the invention.

In an alternative embodiment of the Lorentz actuator, in accordance with the present invention, will be explained with reference to FIG. 4, showing a part thereof FIG. 4 in particular shows the main magnet 205a, and a part of the back mass 207a in this example comprising an iron. In the embodiment as described with reference to FIG. 4, the magnetic element 208a (comprising a permanent magnet) extends between highly magnetically permeable parts (the part 206a being shown in FIG. 4) adjacent to the main magnet (the main magnet 205a being shown) of the first and second magnet system subassemblies.

The magnetic element 208a in this embodiment comprises a side magnet, the side magnet having a polarity in a direction from one of the second magnet system subassemblies to the other one thereof. Advantageously, a polarization of the magnetic element 208a is opposite to a polarization of neighboring main magnets 205a (as shown in FIG. 4) and 205c (not shown in FIG. 4). The magnetic element 208a in FIG. 4 forms part of the subsidiary magnet system, and in fact has a same or similar effect as the magnetic element 208a and 208b as shown in FIG. 2 and FIG. 3b, as a same effect of guiding a magnetic field between 206a and 206d is achieved. In FIG. 2 and FIG. 3b, this effect is achieved by a magnetic polarization of the subsidiary magnets 206a and 206d, while in FIG. 4 a same or similar effect is created by a magnetic polarization of the magnetic element 208a.

In FIG. 4 only a part of the Lorentz actuator is shown, i.e. a left upper part of the cross sectional view as comparable to the cross sectional view of the Lorentz actuator of FIG. 2. It will however be clear to the skilled person how a remainder of the cross sectional view is constituted. As an alternative to the configurations as shown in FIG. 2a and FIG. 4, the magnetic element 208a, 208b can extend from any side of the part 206. Thus, in the embodiment as shown in FIG.

2, the magnetic element 208a can e.g. extend from sides of the subsidiary magnets 206a, 206d facing each other, while in the Lorentz actuator as shown in FIG. 4, the magnetic element 208a can e.g. extend from a side of the part 206a and 206d (not shown in FIG. 4) facing from the adjacent main magnet 205a and 205c respectively.

The Lorentz actuator according to the invention can be applied for highly accurate and/or temperature critical applications with a short stroke in a direction of the force, such as stages and optics in the lithographic apparatus.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:
an illumination system that provides a beam of radiation,
a support structure that supports a patterning device, said patterning device capable of a desired pattern onto said beam of radiation,
a substrate holder that holds a substrate,
a projection system that projects the patterned beam onto said substrate; and
an actuator that produces a force between a first apparatus part and a second part to displace said first and second apparatus parts relative to each, wherein said first apparatus part comprises at least a part of one of said illumination system, said support structure, said substrate holder, and said projection system and said second apparatus part comprises at least another part of one of said illumination system, said support structure, said substrate bolder, and said projection system, said actuator comprising:
a first magnet system subassembly and a second magnet system subassembly that comprise a main magnet system configured to provide a first magnetic field and a subsidiary magnet system configured to provide a second magnetic field, said main and subsidiary magnet systems attached to said first apparatus part;
an electrically conductive element configured to produce said force based on an interaction between an electric current carried by said electrically conductive element and said first and second magnetic fields, said electrically conductive element attached to said second apparatus part and interposed between said first and second magnet system subassemblies; and
a magnetic element extending substantially between outer portions of said first and second magnet system subassemblies, said magnetic element configured to guide a portion of said second magnetic field from one of said first and second magnet system subassemblies to the other one of said first and second magnet system subassemblies,
wherein a distance between said electrically conductive element and said magnetic element is sufficiently large to cause a reluctance force of said actuator to be less than 1% of a maximum force produce by said actuator.

2. The lithographic apparatus of claim 1, wherein said main magnet system and said subsidiary magnet system are arranged in a Halbach configuration.

3. The lithographic apparatus of claim 1, wherein said magnetic element comprises a highly magnetically permeable material.

4. The lithographic apparatus of claim 1, wherein said magnetic element extends between mutually opposing subsidiary magnets comprised in said subsidiary magnet system, wherein said mutually opposing subsidiary magnets have substantially anti-parallel polarizations.

5. The lithographic apparatus of claim 4, wherein said magnetic element extends between sides of said mutually opposing subsidiary magnets relative to adjacent main magnets of said main magnet system.

6. The lithographic apparatus of claim 1, wherein said magnetic element comprises a permanent magnet having a polarity in a direction from one of said first and second magnet system subassemblies to the other one of said first and second magnet system subassemblies.

7. The lithographic apparatus of claim 6, wherein said magnetic element extends between parts comprising a highly magnetically permeable material located adjacent to main magnets of said first and second magnet system subassemblies.

8. An actuator for producing a force between a first and a second part to displace one of said first and second parts relative to the other of said first and second parts, said actuator comprising:
a first actuator subassembly comprising a first magnet system subassembly and a second magnet system subassembly, said first and second magnet system subassemblies comprising a main magnet system configured to provide a first magnetic field and a subsidiary magnet system configured to provide a second magnetic field, said main and subsidiary magnet systems attached to said first part;
a second actuator subassembly comprising an electrically conductive element configured to produce said force based on an interaction between an electric current carried by said electrically conductive element and said first and second magnetic fields, said electrically conductive element attached to said second part and interposed between said first and second magnet system subassemblies; and
a magnetic element extending substantially between outer portions of said first and second magnet system subassemblies, said magnetic element configured to guide a portion of said second magnetic field from one of said first and second magnet system subassemblies to the other one of said first and second magnet system subassemblies,
wherein a distance between said electrically conductive element and said magnetic element is sufficiently large to cause a reluctance force of said actuator to be less than 1% of a maximum force produce by said actuator.

9. The actuator of claim 8, said main magnet system and said subsidiary magnet system being arranged in a Halbach configuration.

10. The actuator of claim 8, wherein said magnetic element comprises a highly magnetically permeable material.

11. The actuator of claim 8, wherein said magnetic element extends between mutually opposing subsidiary magnets comprised in said subsidiary magnet system, wherein said mutually opposing subsidiary magnets have substantially anti-parallel polarizations.

12. The actuator of claim 11, wherein said magnetic element extends between sides of said mutually opposing subsidiary magnets relative to adjacent main magnets of said main magnet system.

13. The actuator of claim 8, wherein said magnetic element comprises a permanent magnet having a polarity in a direction from one of said first and second magnet system subassemblies to the other one of said first and second magnet system subassemblies.

14. The actuator of claim 13, wherein said magnetic element extends between parts comprising a highly magnetically permeable material located adjacent to main magnets of said first and second magnet system subassemblies.

15. A device manufacturing method comprising:
providing a substrate held by a substrate holder;
providing a beam of radiation using an illumination system;
imparting a desired pattern onto said beam of radiation by a patterning device supported by a support structure;
projecting said patterned beam of radiation onto a target portion of said substrate via a projection system;
producing a force to displace a first apparatus part and a second apparatus part relative to each other, wherein said first apparatus part comprises at least a part of one of said illumination system, said support structure, said substrate holder, and said projection system and said second apparatus part comprises at least another portion of one of said illumination system, said support structure, said substrate holder, said force producing comprises:
generating a first magnetic field from a main magnet system of a first magnet system subassembly and a second magnet system subassembly, said main magnet system being attached to said first part;
generating a second magnetic field from a subsidiary magnet system of said first and second magnet system subassemblies, said subsidiary magnet system being attached to said first part;
producing said force based on an interaction between an electric current carried by an electrically conductive element and said first and second magnetic fields, said electrically conductive element being attached to said second part; and
guiding, via a magnetic element extending substantially between outer portions of said first and second magnet system subassemblies, a portion of said second magnetic field from one of said first and a second magnet system subassemblies to the other of said first and second magnet system subassemblies,
wherein a distance between said conductive element and said magnetic element is sufficiently large to cause a reluctance force of said actuator to be less than 1% of a maximum force produce by said actuator.

16. The device manufacturing method of claim 15, wherein the first magnetic field and the second magnetic field are arranged in a Halbach configuration.

* * * * *